US010678966B2

(12) United States Patent
Samuel et al.

(10) Patent No.: US 10,678,966 B2
(45) Date of Patent: Jun. 9, 2020

(54) MODELING CASING/RISER WEAR AND FRICTION FACTOR USING DISCRETE INVERSION TECHNIQUES (71) Applicant: Landmark Graphics Corporation, Houston, TX (US)

(72) Inventors: Robello Samuel, Cypress, TX (US); Manish Kumar Mittal, Houston, TX (US); Aniket, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 0 days.

(21) Appl. No.: 15/311,980

(22) PCT Filed: Jul. 28, 2015

(86) PCT No.: PCT/US2015/042463
§ 371 (c)(1),
(2) Date: Nov. 17, 2016

(87) PCT Pub. No.: WO2016/022337
PCT Pub. Date: Feb. 11, 2016

(65) Prior Publication Data
US 2017/0098020 A1    Apr. 6, 2017

Related U.S. Application Data (60) Provisional application No. 62/032,845, filed on Aug. 4, 2014.

(51) Int. Cl.
*E21B 12/02*  (2006.01)
*E21B 17/00*  (2006.01)
(Continued)

(52) U.S. Cl.
CPC .............. *G06F 30/20* (2020.01); *E21B 41/00* (2013.01); *E21B 41/0092* (2013.01);
(Continued)

(58) Field of Classification Search
CPC .......... E21B 44/00; E21B 45/00; E21B 47/00; E21B 41/0092; E21B 47/0006;
(Continued)

(56) References Cited

U.S. PATENT DOCUMENTS 4,573,540 A   3/1986   Dellinger et al.
5,704,436 A   1/1998   Smith et al.
(Continued)

FOREIGN PATENT DOCUMENTS

WO       2014011171 A1    1/2014
WO    WO-2014/066981 A1    5/2014
(Continued)

OTHER PUBLICATIONS

Kumar et al. ("Analytical Model to Estimate the Downhole Casing Wear Using the Total Wellbore Energy", Journal of Energy Resources Technology, Dec. 2013, 135).*
(Continued)

*Primary Examiner* — Brian Turner (57) ABSTRACT

Predicting casing wear, riser wear, and friction factors in drilling operations may be achieved with data-driven models that use discrete inversion techniques to updated casing wear models, riser wear models, and/or friction factor models. For example, a method may applying a linear inversion technique or a nonlinear inversion technique to one or more parameters of at least one of a casing wear model, a riser wear model, or a friction factor model using historical data from a previously drilled well as input data to produce at least one of an updated casing wear model, an updated riser wear model, or an updated friction factor model, respectively; and implementing the at least one of the updated casing wear model, the updated riser wear model, or the updated friction factor model when designing and/or performing a drilling operation.

20 Claims, 3 Drawing Sheets

(51) Int. Cl.
*E21B 44/06* (2006.01)
*E21B 17/02* (2006.01)
*G06F 30/20* (2020.01)
*E21B 41/00* (2006.01)
*E21B 47/00* (2012.01)
*G05B 17/02* (2006.01)
*G06F 17/13* (2006.01)

(52) U.S. Cl.
CPC .......... *E21B 47/0006* (2013.01); *G05B 17/02* (2013.01); *G06F 17/13* (2013.01)

(58) Field of Classification Search
CPC ..... G05B 15/02; G05B 17/02; G06F 17/5009; G06F 17/13
See application file for complete search history.

(56) References Cited

U.S. PATENT DOCUMENTS

| | | | |
|---|---|---|---|
| 2006/0162962 A1* | 7/2006 | Koederitz | E21B 45/00 175/27 |
| 2007/0168056 A1* | 7/2007 | Shayegi | G05B 13/048 700/48 |
| 2010/0037675 A1 | 2/2010 | Hannahs et al. | |
| 2010/0044110 A1* | 2/2010 | Bangru | C23C 14/0605 175/61 |
| 2010/0259415 A1* | 10/2010 | Strachan | E21B 44/00 340/853.6 |
| 2013/0032404 A1* | 2/2013 | Donderici | E21B 47/024 175/45 |
| 2014/0083687 A1 | 3/2014 | Poe et al. | |
| 2014/0214326 A1 | 7/2014 | Samuel et al. | |
| 2015/0090498 A1* | 4/2015 | Hareland | E21B 43/26 175/48 |
| 2015/0105912 A1* | 4/2015 | Dykstra | E21B 44/00 700/275 |
| 2015/0247397 A1* | 9/2015 | Samuel | E21B 44/005 700/275 |
| 2016/0230528 A1* | 8/2016 | Samuel | E21B 12/02 |
| 2016/0251912 A1* | 9/2016 | Marcuccio | E21B 33/13 166/376 |
| 2016/0273330 A1* | 9/2016 | Dashevsky | E21B 47/0905 |

FOREIGN PATENT DOCUMENTS

WO 2016022337 A1 2/2016
WO WO 2016040139 A1 * 3/2016 ............. G01V 1/282

OTHER PUBLICATIONS

International Search Report and Written Opinion for PCT/US2015/042463 dated Oct. 19, 2015.
Extended European Search Report from European Patent Application No. 15829079.1, dated Jan. 23, 2018, 6 pages.

* cited by examiner

MODELING CASING/RISER WEAR AND FRICTION FACTOR USING DISCRETE INVERSION TECHNIQUES

BACKGROUND

The present disclosure relates to predicting casing wear, riser wear, and friction factors in drilling operations.

In the oil and gas industry, after a wellbore has been drilled, the wellbore is often lined with a string of casing to seal the wellbore and otherwise prevent the collapse of the surrounding subterranean formations penetrated by the wellbore. The string of casing includes several tubular lengths coupled to each other at each end to provide an elongate conduit extendable into the wellbore. After the casing has been secured within the wellbore, the wellbore is often extended even further past the casing, thus requiring drill string and an associated drill bit to be extended into the wellbore through the casing. Contact between the drill string and the casing during drilling can lead to excessive casing wear, which may compromise the integrity of the casing at affected points. If the integrity of the casing is diminished too far, the casing could burst or collapse, or fluid leaks could result.

Casing wear is an inevitable problem in the oil and gas industry and engineers are constantly introducing newer methods or systems intended to prevent or reduce casing wear as far as possible. Computer programs and models often under-predict or over-predict the potential casing wear for a given well system. Due to the inherent uncertainties associated with casing wear estimation, oil and gas engineers typically overdesign the casing to avoid future problems, such as burst, collapse, and leakage, all of which might lead to well abandonment. Overdesign of the casing, however, requires a larger capital investment, which may not be necessary.

BRIEF DESCRIPTION OF THE DRAWINGS

The following figures are included to illustrate certain aspects of the embodiments, and should not be viewed as exclusive embodiments. The subject matter disclosed is amenable to considerable modifications, alterations, combinations, and equivalents in form and function, as will occur to those skilled in the art and having the benefit of this disclosure.

It should be understood, however, that the specific embodiments given in the drawings and detailed description thereto do not limit the disclosure. On the contrary, they provide the foundation for one of ordinary skill to discern the alternative forms, equivalents, and modifications that may be encompassed together with one or more of the given embodiments in the scope of the appended claims.

DETAILED DESCRIPTION

The present disclosure relates to predicting casing wear, riser wear, and friction factors in drilling operations. More specifically, data-driven models described herein may use discrete inversion techniques to update casing wear models, riser wear models, and friction factor models.

The embodiments described herein provide casing wear models, riser wear models, and friction factor models that are data-driven and rely on mathematical inversion techniques. More particularly, the embodiments disclosed herein use available data from a current well to train a casing wear model, a riser wear model, and/or a friction factor model that can be used to further predict the casing wear, riser wear, and/or friction factors in the same well or for another well. The exemplary casing wear models, riser wear models, and friction factor models described herein allow a well operator to better predict casing wear, riser wear, and/or friction factors to prevent casing failure and unnecessary overdesign of casing strings, thereby reducing capital investments. The presently described inversion techniques may also be applied to estimate friction factors that may provide a well operator with an improved torque and drag model that can be applied for well engineering.

Data-driven models using mathematical inversion techniques may be developed to predict the casing wear, riser wear, and/or friction factors during any drilling operation so that casings can be designed accordingly. In some instances, linear inversion techniques may be used to build linear models (e.g., multi-parameter models or one-parameter models). In other embodiments, however, non-linear inversion techniques may be used to build a non-linear model.

The data-driven models may be based on various theoretical models in literature for the calculation of casing or riser wear (V). For example, a Specific Energy Model may utilize Equations 1-6.

$$V = E/e \quad \text{Equation 1}$$

where: V is the volume of the wear (casing or riser wear) (in³/ft)
E is the energy input per unit length (in-lb/ft)
e is the specific energy (in-lb/in³)

$$E = \mu F_n L_s \quad \text{Equation 2}$$

where: µ is the friction factor (dimensionless)
$F_n$ is the lateral load on tool joint per unit length (lb/ft)
$L_s$ is the sliding distance (in)

$$L_s = \pi N D_{tj} t \quad \text{Equation 3}$$

where: N is the rotary speed (rpm)
$D_{tj}$ is the tool-joint diameter (in)
t is the contact time (min)

$$t = (L * L_{tj})/(ROP * L_{dp}) \quad \text{Equation 4}$$

where: L is the drilling distance (ft)
$L_{tj}$ is the tool-joint length (ft)
ROP is the rate of penetration (ft/hr)
$L_{dp}$ is the length of drill pipe (ft)

$$f_w = \mu/e \quad \text{Equation 5}$$

where: $f_w$ is the wear factor (in²/lb)

$$V = \Sigma_{i=1}^n \Delta V_i \quad \text{Equation 6}$$

where: $\Delta V_i$ is the incremental wear volume for each incremental drilling distance In another example, a Linear Wear-Efficiency Model may utilize Equation 7 to calculate V.

$$V = \frac{\eta}{H_b} \int \mu F_n L \, dl = f_w \int \mu F_n L \, dl \quad \text{Equation 7}$$

where: η is the wear efficiency (dimensionless)
$H_b$ is the casing Brinell hardness (N/m$^3$)
$f_w$ is the wear factor
$F_n$ is the contact force between the drill string and the casing (N/m)
L is the distance slid (m)
μ is the circumferential friction coefficient In yet another example, a Wellbore Energy Model may utilize Equations 8-12 to calculate V.

$$E_s = \int_0^L (k(x)^2 + \tau(x)^2) dx \qquad \text{Equation 8}$$

where: $E_s$ is the strain energy of the wellbore path
k(x) is curvature of wellbore trajectory (deg/100 ft)
τ(x) is torsion of wellbore trajectory (deg/100 ft)
x is position of any point along the wellbore $$\beta = \sqrt{E_s L}/100 \qquad \text{Equation 9}$$

where: β is the borehole curvature
L is length of the curved section $$F_s = \sqrt{\frac{((F_e \Delta \varphi)^2 + W_b^2)\gamma^2}{\sin^2\left(\frac{\Delta \varphi}{2}\right)} \pm \frac{2F_e \Delta \alpha W_b \gamma}{\sin\left(\frac{\Delta \varphi}{2}\right)} + (F_e \Delta \alpha)^2} \qquad \text{Equation 10}$$

where: $F_s$ is the side force
$F_e$ is effective tension at the bottom of the section
φ is azimuth angle
$W_b$ is buoyed weight of drill string
γ is defined in Eq. 11
α is inclination angle $$\gamma = \sqrt{\sin^2\left(\frac{\beta}{2} - \sin^2\left(\frac{\Delta \alpha}{2}\right)\right)} \qquad \text{Equation 11}$$

$$V = f_w * F_s * \pi D_{tj} * 60 N * t * f \qquad \text{Equation 12}$$

where: $f_w$ is the wear factor
$D_{tj}$ is the tool-joint diameter (in)
t is the contact time (min)
f is ratio of the tool-joint length (ft) to length of drill pipe (ft)

Each of the foregoing exemplary models for calculating V have model parameters (e.g., $f_w$) as inputs. The methods and analyses of the present disclosure use the behavior of the available data to calculate the model parameters. That is, the data from a drilling system (e.g., as measured by sensors or derived from sensor measurements) may be used to train a model of the present disclosure using discrete inversion techniques (e.g., linear inversion or non-linear inversion).

Figure 1:
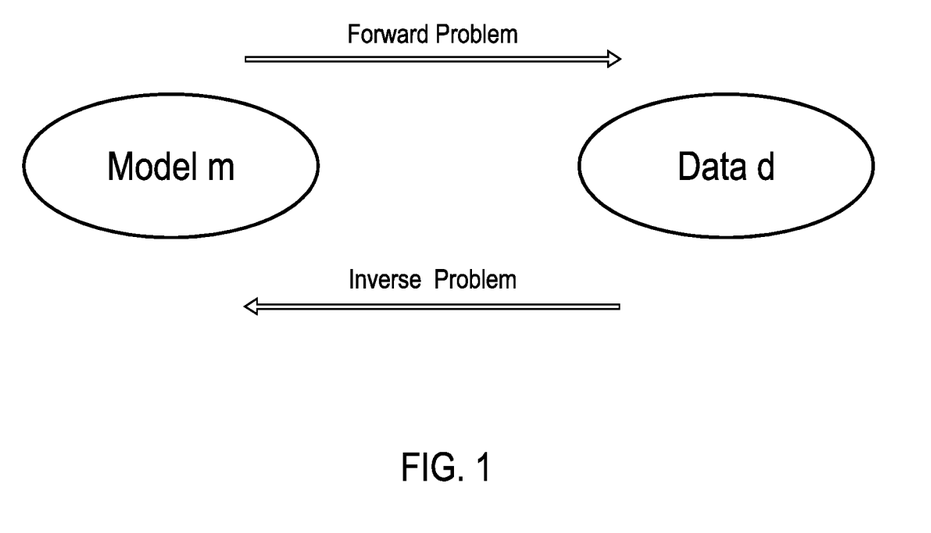
FIG. 1 provides a basic illustrative diagram of the linear inversion technique.

FIG. 1 provides a basic illustrative diagram of the linear inversion technique. Using a model (m) (e.g., one of the foregoing models for calculating V) to calculate or otherwise predict an output data (d) is known as the "forward problem." Additionally, d may be used to obtain m, which is known as the "inverse problem." More particularly, in the linear inversion technique, an input data set and an output data set are provided and used to obtain an m that would further predict the output data for other input points. Because Gm=d, m can be represented mathematically as Equation 13.

$$m = G^{-1} d \qquad \text{Equation 13}$$

where: G is the input data
m is the model
d is the output data

In some instances, the input matrix might not be a square matrix, which is required to calculate its inverse. To place the input matrix in square matrix form, a least squares method may be used to calculate m. To accomplish this, the input matrix may be assumed to an initial model, and then the data set may be calculated according to Equation 14.

$$\hat{d} = Gm \qquad \text{Equation 14}$$

where: $\hat{d}$ is the predicted data vector

The error$^2$ may be minimized according to Equation 15 by varying m.

$$\frac{d(\text{error})^2}{dm} = 0 \qquad \text{Equation 15}$$

Accordingly, for the linear model, Equation 16 may be derived.

$$m = (G^T G)^{-1} G^T d \qquad \text{Equation 16}$$

For a non-linear inversion technique, a Taylor series expansion may be applied to linearize the equations d=g(m). Using Taylor series expansion around an assumed model set $m_o$ provides Equations 17 and 18.

$$d_i = g_i(m_o) + \sum_{j=1}^{M} \left[ \frac{\partial g_i(m)}{\partial m_j} \bigg|_{m=m_o} \cdot \Delta m_j \right] + \qquad \text{Equation 17}$$

$$\frac{1}{2} \sum_{j=1}^{M} \left[ \frac{\partial^2 g_i(m)}{\partial m_j^2} \bigg|_{m=m_o} \cdot \Delta m_j^2 \right] + \ldots$$

$$\Delta m = m - m_o \qquad \text{Equation 18}$$

Now assuming Δm is small, the higher order terms of Δm may be neglected and Equation 19 derived.

$$d_i = g_i(m_o) + \sum_{j=1}^{M} \left[ \frac{\partial g_i(m)}{\partial m_j} \bigg|_{m=m_o} \cdot \Delta m_j \right] \qquad \text{Equation 19}$$

The predicted data is represented by Equations 20 and 21, where $\Delta c_i$ is the misfit vector.

$$d_i = g_i(m_o) \qquad \text{Equation 20}$$

$$\Delta c_i = d_i - \hat{d}_i \qquad \text{Equation 21}$$

Hence, the misfit vector ($\Delta c_i$) can be represented by Equation 24 expanded or in matrix version Equation 25, which is derived from Equations 22-23.

$$\Delta c_i = \sum_{j=1}^{M} \left[ \frac{\partial g_i(m)}{\partial m_j} \bigg|_{m=m_o} \cdot \Delta m_j \right] \qquad \text{Equation 22}$$

$$G_{ij} = \frac{\partial g_i(m)}{\partial m_j} \bigg|_{m=m_o} \qquad \text{Equation 23}$$

-continued $$\Delta c_i = \sum_{j=1}^{M} [G_{ij} \cdot \Delta m_j] \bigg|_{m=m_o} \quad \text{Equation 24}$$

$$\Delta c = G \Delta m \quad \text{Equation 25}$$

Implementing the non-linear inversion technique may include the following steps:
Selecting a starting model vector $m_o$;
Calculating the predicted data vector $\hat{d}$ and forming the misfit vector $\Delta c_i$;
Forming $G_{ij}$;
Solving for $\Delta m$ using least square methods;
Forming a new model vector $m_1 = m_0 + \Delta m$; and
Repeating the foregoing steps until either $\Delta m$ or $\Delta c$ become sufficiently small.

The above-described linear and non-linear inversion techniques may be used for predicting and modeling casing wear, riser wear, and friction factors given a data set for a particular wellbore according to any of the previously described casing and riser wear models, any casing wear models not explicitly described, any riser wear models not explicitly described, and any friction factor models. The resulting model may subsequently be used to further predict the casing wear data, the riser wear data, and/or friction factor data for the same wellbore or a different wellbore in its proximity.

When modeling casing wear, riser wear, and friction factors, a discrete inversion technique may be applied to one or more parameters of the model. By way of nonlimiting example, three scenarios are described herein. In some embodiments of the present disclosure, other combinations of one or more parameters and an inversion technique may be implemented.

In the first nonlimiting example, a single parameter ($f_w$) is trained in a model using a linear inversion technique. First, the parameter is extracted from the model. This can be generalized by Equations 26-28.

$$V = \sum_i^n \Delta V \quad \text{Equation 26}$$

$$\Delta V = f(f_w, F_n, N, D_{tj}, t) \quad \text{Equation 27}$$

$$V = f_w \sum_{i=1}^{n} F_n N D_{tj} t \quad \text{Equation 28}$$

Then, the linear inversion technique is performed using Equation 28 in Equation 16 above where the inputs (G) are $F_n$, N, $D_{tj}$, and t, the model parameter (m) is $f_w$, and the data (d) is V. This exemplary method provides a good technique for more accurately estimating casing wear, riser wear, and friction factors so as to mitigate overdesign of the casing or to prevent casing failures. However, additional accuracy may be gained by applying a discrete inversion technique to multiple parameters.

In a second nonlimiting example, a linear inversion technique is used to train five parameters. Again, Equations 26-27 generally describe the model. In this instance, however, since all five parameters are being trained, Equations 29-31 provide a derivation to the extended form of Equation 13 used for training the parameters.

$$V = f_w F_{nAvg}{}^a N^b D_{tj}{}^c t^d \quad \text{Equation 29}$$

$$\text{Log } V = \text{Log } f_w + a \text{ Log } F_{nAvg} + b \text{ Log } N + c \text{ Log } D_{tj} + d \text{ Log } t \quad \text{Equation 30}$$

$$\overline{V} = f_w + a \overline{F_{nAvg}} + b \overline{N} + c \overline{D_{tj}} + d \overline{t} \quad \text{Equation 31}$$

Then, the linear inversion technique is performed using Equation 31 in Equation 16 above where the inputs (G) are $F_{nAvg}$, N, $D_{tj}$, and t, the model parameter (m) is $f_w$, a, b, c, and d, and the data (d) is V. This exemplary method provides a good technique for more accurately estimating casing wear, riser wear, and friction factors so as to mitigate overdesign of the casing or to prevent casing failures. However, in a linear inversion technique, the average force ($F_{nAvg}$) has to be used to keep the equations linear. To account for individual drilling steps performed during a drilling operation, a nonlinear inversion technique may be used.

In a third nonlimiting example, a nonlinear inversion technique is used to train five parameters. Again, Equations 26-27 generally describe the model. Further, five parameters are trained leading to Equation 32, which differs from Equation 31 in that $F_n$ is used rather than $F_{nAvg}$.

$$\overline{V} = f_w + a \overline{F_n} + b \overline{N} + c \overline{D_{tj}} + d \overline{t} \quad \text{Equation 32}$$

When implementing, the nonlinear inversion technique is performed iteratively as described above until $\Delta c$ become sufficiently small.

This method of building a casing wear model, a riser wear model, and/or a friction factor model does not use any experimental methods or back calculation methods to calculate the wear factor, and this may prove to be advantageous for these models. Rather, the presently disclosed methods use the behavior of the available data to calculate the model parameters, such as wear factors, that would further predict the casing and/or riser wear in similar circumstances. In some instances, the methods and analyses also have the flexibility to build models with multiple trained parameters where not all of the uncertainties are rolled into the wear factor.

Figure 2:
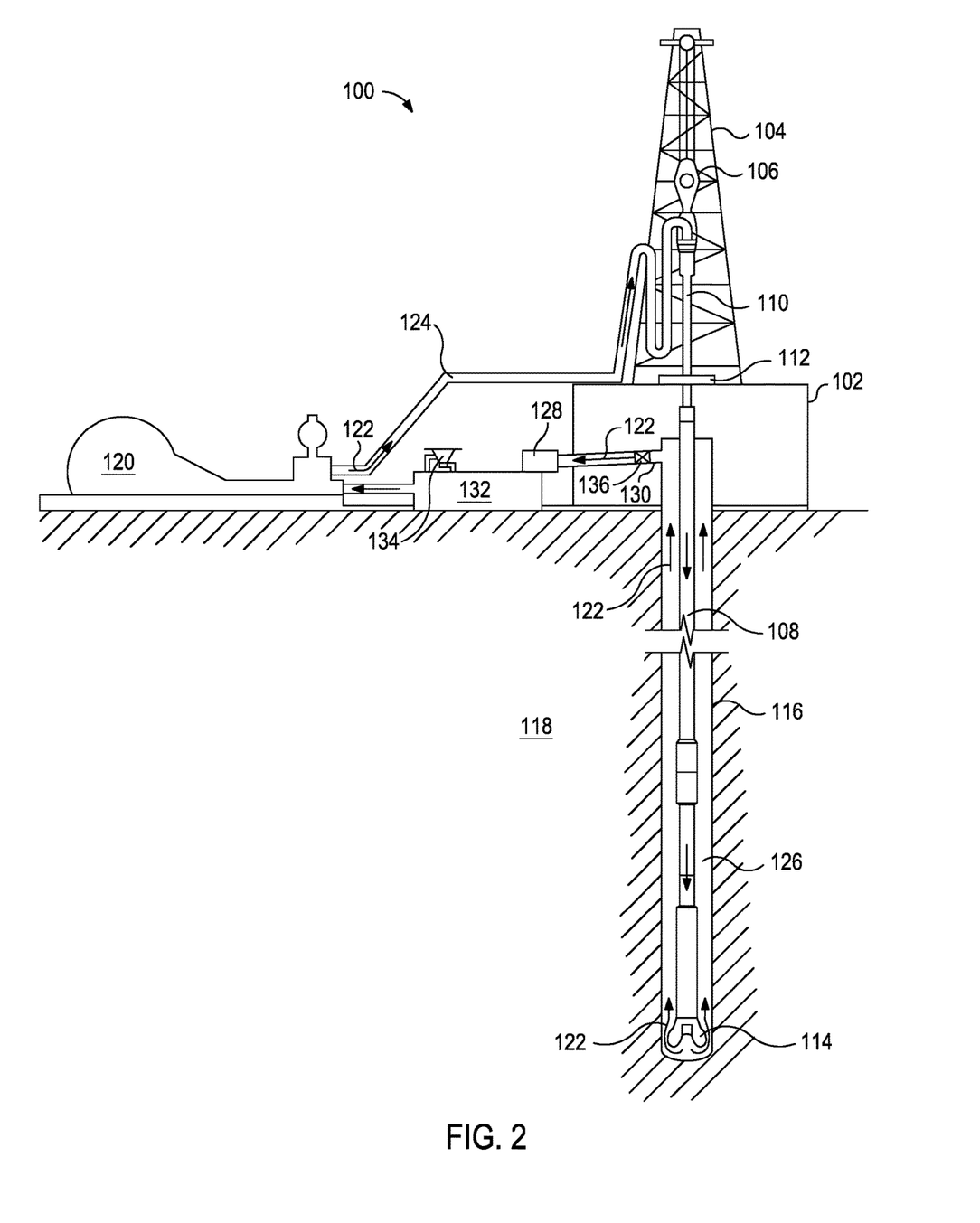
FIG. 2 is an exemplary drilling system suitable for implementing the methods described herein.

FIG. 2 illustrates an exemplary drilling system suitable for implementing the methods and analyses described herein. While FIG. 2 generally depicts a land-based drilling assembly, those skilled in the art will readily recognize that the principles described herein are equally applicable to subsea drilling operations that employ floating or sea-based platforms and rigs, without departing from the scope of the disclosure.

As illustrated, the drilling assembly 100 may include a drilling platform 102 that supports a derrick 104 having a traveling block 106 for raising and lowering a drill string 108. The drill string 108 may include, but is not limited to, drill pipe and coiled tubing, as generally known to those skilled in the art. A kelly 110 supports the drill string 108 as it is lowered through a rotary table 112. A drill bit 114 is attached to the distal end of the drill string 108 and is driven either by a downhole motor and/or via rotation of the drill string 108 from the well surface. As the bit 114 rotates, it creates a borehole 116 that penetrates various subterranean formations 118.

A pump 120 (e.g., a mud pump) circulates mud 122 through a feed pipe 124 and to the kelly 110, which conveys the mud 122 downhole through the interior of the drill string 108 and through one or more orifices in the drill bit 114. The mud 122 is then circulated back to the surface via an annulus 126 defined between the drill string 108 and the walls of the borehole 116. At the surface, the recirculated or spent mud 122 exits the annulus 126 and may be conveyed through chokes 136 (also referred to as a choke manifold) to one or more mud cleaning unit(s) 128 (e.g., a shaker, a centrifuge, a hydrocyclone, a separator (including magnetic and/or electrical separators), a desilter, a desander, a separator, a filter, a heat exchanger, any fluid reclamation equipment, and the like) via an interconnecting flow line 130. After passing through the mud cleaning unit(s) 128, a "cleaned" mud 122 is deposited into a nearby retention pit 132 (e.g., a mud pit or mud tank). While illustrated as being arranged at the outlet of the wellbore 116 via the annulus 126, those skilled in the art will readily appreciate that the mud cleaning unit(s) 128 may be arranged at any other location in the drilling assembly 100 to facilitate its proper function, without departing from the scope of the scope of the disclosure.

At the retention pit 132 (or before or after), the drilling system may include one or more mud treatment units. The mud 122 may be treated to change its composition and properties. For example, weighting agents like barite may be added to the mud 122 to increase its density. In another example, base fluid may be added to the mud 122 to decrease its density. In the illustrated drilling system 100, the addition of materials to the mud 122 may be achieved with a mixing hopper 134 communicably coupled to or otherwise in fluid communication with the retention pit 132. The mixing hopper 134 may include, but is not limited to, mixers and related mixing equipment known to those skilled in the art. In other embodiments, however, the materials may be added to the mud 122 at any other location in the drilling assembly 100. In at least one embodiment, for example, there could be more than one retention pit 132, such as multiple retention pits 132 in series. Moreover, the retention pit 132 may be representative of one or more fluid storage facilities and/or units where the materials may be stored, reconditioned, and/or regulated until added to the mud 122.

The various components of the drilling system 100 may further include one or more sensors, gauges, pumps, compressors, and the like used store, monitor, regulate, convey, and/or recondition the exemplary muds 122 (e.g., sensors and gauges to measure the composition and/or pressure of the mud, compressors to change the pressure of the mud, and the like).

While not specifically illustrated herein, the disclosed drilling system 100 may further include drill collars, mud motors, downhole motors and/or pumps associated with the drill string 108, MWD/LWD tools and related telemetry equipment, sensors or distributed sensors associated with the drill string 108, downhole heat exchangers, valves and corresponding actuation devices, tool seals, packers and other wellbore isolation devices or components, and the like. The drilling system 100 may also further include a control system communicably coupled to various components of the drilling system 100 (e.g., tools, pumps, sensors, and the like) and be capable of executing the mathematical algorithms, methods, and drilling system control described herein.

The methods and analyses described herein may, in some embodiments, be used when designing a drilling operation. For example, when a drilling operation is simulated (e.g., using mathematical models stored and executed on a control system), a casing wear model, a riser wear model, and/or a friction factor model with parameters trained by a discrete inversion technique may be used in simulating the drilling operations, including any design considerations for the casing.

The control system(s) (e.g., used at a drill site or in simulating a drilling operation) and corresponding computer hardware used to implement the various illustrative blocks, modules, elements, components, methods, and algorithms described herein can include a processor configured to execute one or more sequences of instructions, programming stances, or code stored on a non-transitory, computer-readable medium. The processor can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some embodiments, computer hardware can further include elements such as, for example, a memory (e.g., random access memory (RAM), flash memory, read only memory (ROM), programmable read only memory (PROM), erasable programmable read only memory (EPROM)), registers, hard disks, removable disks, CD-ROMs, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor to perform the process steps described herein. One or more processors in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to a processor for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM and flash EPROM.

For example, the control system(s) described herein may be configured for receiving inputs, which may be real or simulated data. The processor may also be configured to perform the discrete inversion technique on a model or parameters thereof that are stored on the processor. The output may be a numerical value indicative of casing wear, riser wear, and friction factors, a pictorial representation of casing wear, riser wear, and friction factors, a recommendation of the casing configuration to be implemented (e.g., casing composition and thickness as a function of location along the wellbore), or the like.

Embodiments described herein include Embodiments A, B, and C and may further include one or more additional elements described below.

Embodiment A is a method comprising: applying a linear inversion technique or a nonlinear inversion technique to one or more parameters of at least one of a casing wear model, a riser wear model, or a friction factor model using historical data from a previously drilled well as input data to produce at least one of an updated casing wear model, an updated riser wear model, or an updated friction factor model, respectively; and implementing the at least one of the updated casing wear model, the updated riser wear model, or the updated friction factor model when designing and/or performing a drilling operation.

Embodiment B is a drilling system comprising: a drill bit coupled to an end of a drill string extending into a wellbore, wherein a portion of the wellbore is lined with casing; a pump operably connected to the drill string for circulating a drilling fluid through the wellbore; a control system that includes a non-transitory medium readable by a processor and storing instructions for execution by the processor for performing a method comprising: applying a linear inversion technique or a nonlinear inversion technique to one or more parameters of at least one of a casing wear model, a riser wear model, or a friction factor model using historical data from a previously drilled well as input data to produce at least one of an updated casing wear model, an updated riser wear model, or an updated friction factor model, respectively.

Embodiment C is a non-transitory medium readable by a processor and storing instructions for execution by the processor for performing a method comprising: applying a linear inversion technique or a nonlinear inversion technique to one or more parameters of at least one of a casing wear model, a riser wear model, or a friction factor model using historical data from a previously drilled well as input data to produce at least one of an updated casing wear model, an updated riser wear model, or an updated friction factor model, respectively.

Exemplary elements that may be further included in Embodiments A, B, or C may include, but are not limited to, (1) wherein the casing wear model and/or the riser wear model are a specific energy model; (2) wherein the casing wear model and/or the riser wear model are a linear wear-efficiency model; (3) wherein the casing wear model and/or the riser wear model are a wellbore energy model; (4) wherein the one or more parameters include at least one of a wear factor, a lateral load on a tool joint per unit length, a rotary speed, a tool joint diameter, or a contact time; or combinations thereof like, for example, (1) and (2), (1) and (3), (2) and (3), and one or more of (1)-(3) with (4). Embodiments B or C may further include (5) wherein the method performed by the control system further comprises: implementing the at least one of the updated casing wear model, the updated riser wear model, or the updated friction factor model when designing a drilling operation; or (6) wherein the method performed by the control system further comprises: implementing the at least one of the updated casing wear model, the updated riser wear model, or the updated friction factor model when performing a drilling operation with the drilling system. (5) and (6) may both or individually be in combination with one or more of (1)-(4) including the foregoing combinations of (1)-(4).

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

One or more illustrative embodiments incorporating the invention embodiments disclosed herein are presented herein. Not all features of a physical implementation are described or shown in this application for the sake of clarity. It is understood that in the development of a physical embodiment incorporating the embodiments of the present invention, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

While compositions and methods are described herein in terms of "comprising" various components or steps, the compositions and methods can also "consist essentially of" or "consist of" the various components and steps.

To facilitate a better understanding of the embodiments of the present invention, the following examples of preferred or representative embodiments are given. In no way should the following examples be read to limit, or to define, the scope of the invention.

EXAMPLES

Figure 3:
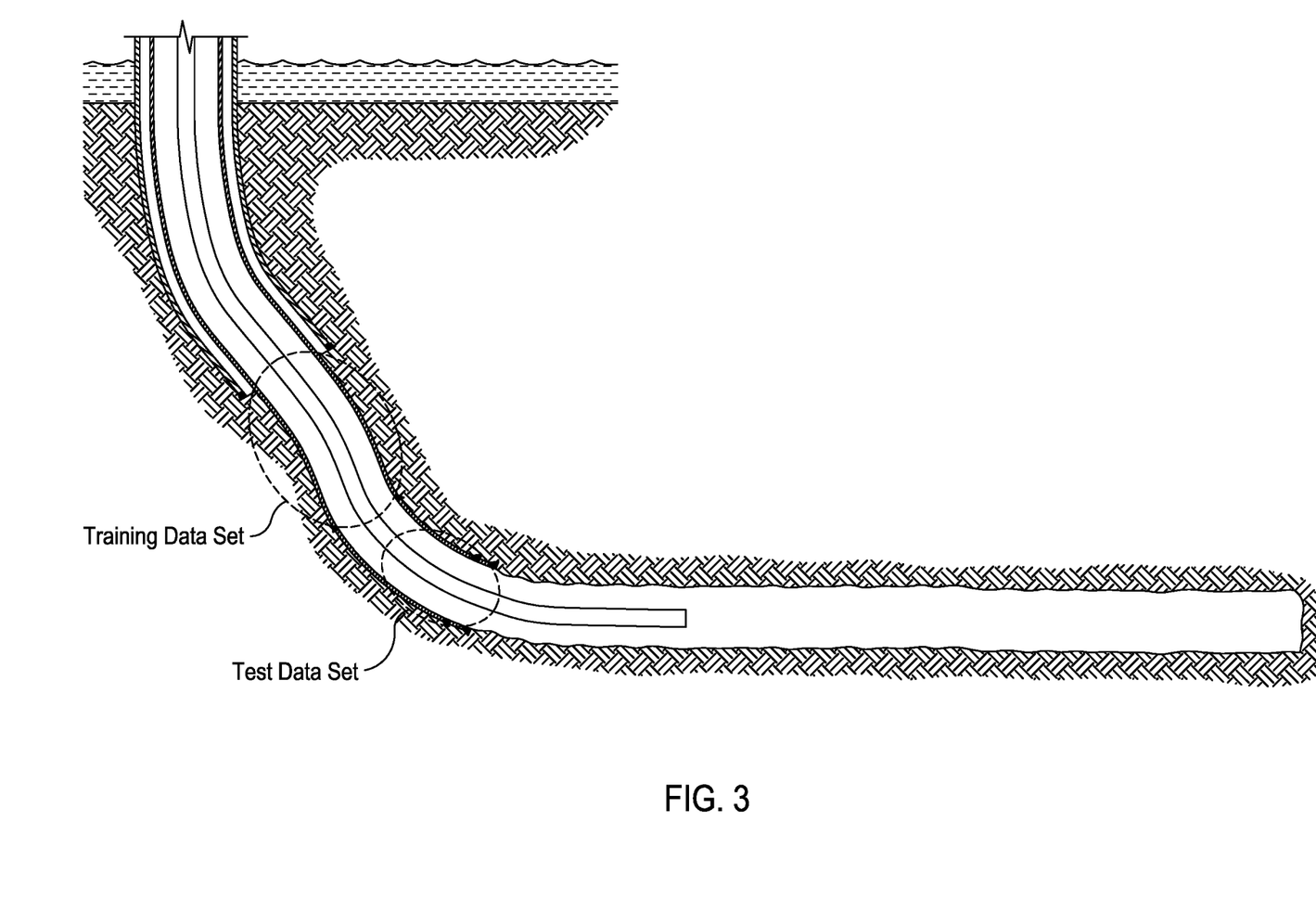
FIG. 3 provides a schematic of a well and corresponding casing wear log that were used to train parameters of a casing wear model according to the three exemplary analyses described herein.

FIG. 3 provides a schematic of a well used to train parameters of a casing wear model according to the three exemplary analyses described herein: a linear inversion/one-parameter training, a linear inversion/five-parameter training, and a nonlinear inversion/five parameter training.

From the data in the upper portion of the wellbore, the groove depth ($d_g$) into the casing was measured at various depths. As described above, data (d) is V. Then, V was calculated using Equations 33-35.

$$V = 12 * (\beta * r_{string}^2 + \qquad \text{Equation 33}$$
$$r_{string} * (r_{casing} - r_{string} + d_g) * \sin(\alpha) - \alpha * r_{casing}^2)$$

$$\alpha = \cos^{-1}( \qquad \text{Equation 34}$$
$$1 - (d_g * (d_{string} - d_g) / (d_{casing} * (r_{casing} - r_{string} + d_g))))$$

$$\beta = \sin^{-1}\left(\frac{r_{casing}}{r_{string}} * \sin(\alpha)\right) \qquad \text{Equation 35}$$

where: $d_{string}$ is the diameter of the drill string $d_{casing}$ is the diameter of the casing $r_{string}$ is the radius of the drill string $r_{casing}$ is the radius of the casing The output parameter (V) has now been calculated. All inputs (G) of $F_n$, N, $D_{tj}$, and t were known except the $F_n$. $F_n$ was obtained from DECISION SPACE WELL ENGINEERING (modeling software available from Halliburton Energy Services, Inc.) by feeding the well profile and other required parameters into the software. The force calculation was done at each interval of certain depth as force varies with moving drill-bit. This was done at intervals because calculating force at each and every point was excessive in both raw data and computing requirements for the modeling analyses described herein. One example of $F_n$ calculation is provided in Table 1.

| Depth | | Depth of drill bit in feet | | | | | | | |
|---|---|---|---|---|---|---|---|---|---|
| (feet) | $d_g$ | 6186 | 6269 | 6363 | 6450 | 6541 | 6677 | 6677 | |
| 3312.65 | 0.01119 | 4 | 4 | 4 | 4 | 4 | 4 | 4 | Side force Fn in lbf |
| 3315.65 | 0.01347 | 4 | 4 | 4 | 4 | 4 | 4 | 4 | |
| 3322.15 | 0.0072 | 4 | 4 | 4 | 4 | 4 | 4 | 3 | |
| 3325.65 | 0.00229 | 4 | 4 | 4 | 4 | 4 | 4 | 3 | |
| 3329.15 | 6E−05 | 4 | 4 | 4 | 4 | 4 | 4 | 3 | |
| 3332.15 | 0.00292 | 5 | 4 | 4 | 4 | 4 | 4 | 3 | |
| 3335.65 | 0.00071 | 5 | 4 | 4 | 4 | 4 | 4 | 3 | |
| 3338.65 | 0.01 | 5 | 4 | 4 | 4 | 4 | 4 | 3 | |
| 3345.14 | 0.0027 | 5 | 18 | 4 | 4 | 4 | 12 | 3 | |
| 3352.14 | 0.11475 | 5 | 18 | 4 | 19 | 4 | 12 | 19 | |
| 3355.14 | 0.12825 | 5 | 18 | 4 | 19 | 4 | 12 | 19 | |
| 3358.64 | 0.01945 | 5 | 18 | 4 | 19 | 4 | 12 | 19 | |
| 3361.64 | 0.01337 | 25 | 18 | 26 | 19 | 25 | 12 | 19 | |
| 3365.14 | 0.01074 | 25 | 18 | 26 | 19 | 25 | 12 | 19 | |
| 3368.14 | 0.01456 | 25 | 18 | 26 | 19 | 25 | 12 | 19 | |
| 3371.64 | 0.03336 | 25 | 18 | 26 | 19 | 25 | 25 | 19 | |
| 3374.64 | 0.02665 | 25 | 18 | 26 | 19 | 25 | 25 | 19 | |
| 3378.13 | 0.03795 | 25 | 25 | 26 | 25 | 25 | 25 | 24 | |
| 3381.63 | 0.04094 | 25 | 25 | 26 | 25 | 25 | 25 | 24 | |
| 3384.63 | 0.03805 | 25 | 25 | 26 | 25 | 25 | 25 | 24 | |

After $F_n$ was calculated, the summation of force multiplied by time was calculated. Then, $f_w$ was calculated using the linear inversion technique where the log of the equation was taken to keep the equation linear.

Using the same data, the linear inversion/five-parameter training and the nonlinear inversion/five parameter training were performed also using the training data set for the portion of the wellbore illustrated in FIG. 3. Accordingly, three updated models were produced—a trained linear inversion/one-parameter model, a trained linear inversion/three-parameter model, and a trained nonlinear inversion/three-parameter model. Each of the updated models was then applied to the test data set illustrated in FIG. 3 to ascertain a predicted casing wear. The predicted casing wear for each model was then compared to the actual casing wear for that portion of the wellbore. The $R^2$ values (a statistical measure of how well two data sets agree, where 1 is an exact match) in the predicted/actual casing wear analysis were 0.70 for the trained linear inversion/one-parameter model, 0.95 for the trained linear inversion/five-parameter model, and 0.97 for the trained nonlinear inversion/five-parameter model. This illustrates that each updated model provides a good model of casing wear. In this instance, the two five-parameter models were better than the one-parameter model. Using five-parameters, both the linear and nonlinear inversion provided excellent agreement with the actual data. This example illustrates that the inversion techniques described herein for updating casing wear models, riser wear models, and friction force models improve the modeling, which may, in turn, reduce over-design of casings in downhole operations.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each member of the list (i.e., each item). The phrase "at least one of" allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

What is claimed is:

1. A method comprising:
    receiving, by a processor of a drilling system, measurements from one or more sensors associated with a drill string of the drilling system that extends into a wellbore being drilled through a subterranean formation, wherein a first portion of the wellbore that was previously drilled within the subterranean formation is lined with casing;

applying, by the processor, a linear inversion technique or a nonlinear inversion technique to one or more parameters of at least one of a casing wear model or a riser wear model using the measurements received for the previously drilled first portion of the wellbore as input data to produce at least one of an updated casing wear model or an updated riser wear model, respectively;

estimating, by the processor, at least one of casing wear or riser wear for a second portion of the wellbore to be drilled through the subterranean formation, based on at least one of the updated casing wear model or the updated riser wear model; and controlling, by the processor, a drill bit at the end of the drill string to drill the second portion of the wellbore through the subterranean formation, based on the estimation.

2. The method of claim 1, wherein the at least one of the casing wear model or the riser wear model is a specific energy model.

3. The method of claim 1, wherein the at least one of the casing wear model or the riser wear model is a linear wear-efficiency model.

4. The method of claim 1, wherein the at least one of the casing wear model or the riser wear model is a wellbore energy model.

5. The method of claim 1, wherein the one or more parameters include at least one of a wear factor, a lateral load on a tool joint per unit length, a rotary speed, a tool joint diameter, or a contact time.

6. The method of claim 1, wherein estimating at least one of the casing wear and the riser wear comprises:

generating a prediction of a volume of at least one of the casing wear or the riser wear for the second portion of the wellbore to be drilled, based at least in part on at least one of the updated casing wear model or the updated riser wear model, respectively.

7. A drilling system comprising:

a drill bit coupled to an end of a drill string extending into a wellbore being drilled through a subterranean formation, wherein a first portion of the wellbore that was previously drilled within the subterranean formation is lined with casing;

a pump operably connected to the drill string for circulating a drilling fluid through the wellbore; and a control system that includes a non-transitory medium readable by a processor and storing instructions that when executed by the processor cause the control system to facilitate controlling the drill bit to perform a drilling operation by:

receiving measurements from one or more sensors associated with the drill string;

applying a linear inversion technique or a nonlinear inversion technique to one or more parameters of at least one of a casing wear model or a riser wear model using the measurements received for the previously drilled first portion of the wellbore as input data to produce at least one of an updated casing wear model or an updated riser wear model, respectively;

estimating at least one of casing wear or riser wear for a second portion of the wellbore to be drilled through the subterranean formation, based on at least one of the updated casing wear model or the updated riser wear model; and controlling the drill bit at the end of the drill string to drill the second portion of the wellbore through the subterranean formation, based on the estimation.

8. The drilling system claim 7, wherein the instructions executed by the processor further cause the control system to implement the at least one of the updated casing wear model and the updated riser wear model for estimating a volume of at least one of the casing wear and the riser wear for the second portion of the wellbore to be drilled.

9. The drilling system of claim 7, wherein the one or more parameters are selected from the group consisting of: a diameter of the drill string; a diameter of the casing along the first portion of the wellbore; a radius of the drill string; and a radius of the casing.

10. The drilling system claim 7, wherein the at least one of the casing wear model or the riser wear model is a specific energy model.

11. The drilling system claim 7, wherein the at least one of the casing wear model or the riser wear model is a linear wear-efficiency model.

12. The drilling system claim 7, wherein the at least one of the casing wear model or the riser wear model is a wellbore energy model.

13. The drilling system claim 7, wherein the one or more parameters include at least one of a wear factor, a lateral load on a tool joint per unit length, a rotary speed, a tool joint diameter, or a contact time.

14. A non-transitory computer-readable medium readable by a processor and storing instructions that when executed by the processor cause the processor to:

receive measurements from one or more sensors associated with a drill string that extends into a wellbore being drilled through a subterranean formation, wherein a first portion of the wellbore that was previously drilled within the subterranean formation is lined with casing;

apply a linear inversion technique or a nonlinear inversion technique to one or more parameters of at least one of a casing wear model or a riser wear model using the measurements received for the previously drilled first portion of the wellbore as input data to produce at least one of an updated casing wear model or an updated riser wear model, respectively;

estimate at least one of casing wear or riser wear for a second portion of the wellbore to be drilled through the subterranean formation, based on at least one of the updated casing wear model or the updated riser wear model; and control a drill bit at the end of the drill string to drill the second portion of the wellbore through the subterranean formation, based on the estimation.

15. The non-transitory computer-readable medium of claim 14, wherein the instructions executed by the processor further cause the processor to estimate a volume of at least one of the casing wear and the riser wear for the second portion of the wellbore using the at least one of the updated casing wear model and the updated riser wear model.

16. The non-transitory computer-readable medium of claim 14, wherein the one or more parameters are selected from the group consisting of: a diameter of the drill string; a diameter of the casing along the first portion of the wellbore; a radius of the drill string; and a radius of the casing.

17. The non-transitory computer-readable medium of claim 14, wherein the at least one of the casing wear model or the riser wear model is a specific energy model.

18. The non-transitory computer-readable medium of claim 14, wherein the at least one of the casing wear model or the riser wear model is a linear wear-efficiency model.

19. The non-transitory computer-readable medium of claim 14, wherein the at least one of the casing wear model or the riser wear model is a wellbore energy model.

20. The non-transitory computer-readable medium of claim 14, wherein the one or more parameters include at least one of a wear factor, a lateral load on a tool joint per unit length, a rotary speed, a tool joint diameter, or a contact time.

* * * * *